United States Patent [19]
Burstedt et al.

[11] Patent Number: 5,801,928
[45] Date of Patent: Sep. 1, 1998

[54] ELECTRONIC ASSEMBLY CIRCUIT BOARD INSTALLATION APPARATUS

[75] Inventors: Douglas C. Burstedt; Aaron J. Palumbo; Robert S. Haider; Tony A. Reyes, all of San Diego, Calif.

[73] Assignee: Hughes Electronics Corporation, El Segundo, Calif.

[21] Appl. No.: 601,559

[22] Filed: Feb. 14, 1996

[51] Int. Cl.⁶ ............................................. H05K 7/14
[52] U.S. Cl. .................. 361/801; 361/752; 361/802; 361/756; 361/759
[58] Field of Search ........................... 361/752, 753, 361/799, 800, 801, 802, 756, 759, 726, 732, 740, 741, 747–748; 211/41.12, 41.17

[56] References Cited

U.S. PATENT DOCUMENTS 5,400,214  3/1995  Antonuccio et al. ................. 361/683
5,452,184  9/1995  Scholder et al. ...................... 361/799
5,521,793  5/1996  Dalgleish et al. ..................... 361/752

*Primary Examiner*—Leo P. Picard
*Assistant Examiner*—Phuong T. Vu
*Attorney, Agent, or Firm*—Michael Sales; John Whelan

[57] ABSTRACT

A circuit board guide and retaining apparatus to facilitate the alignment and installation of a circuit board within an electronic assembly chassis is disclosed. The circuit board guide and retaining apparatus includes a combination of alignment structures for aligning the circuit board in a prescribed orientation parallel to the base of the electronic assembly chassis and retention structures for preventing the circuit board from substantial displacement in lateral and/or vertical directions during and after the installation of the circuit board.

25 Claims, 6 Drawing Sheets

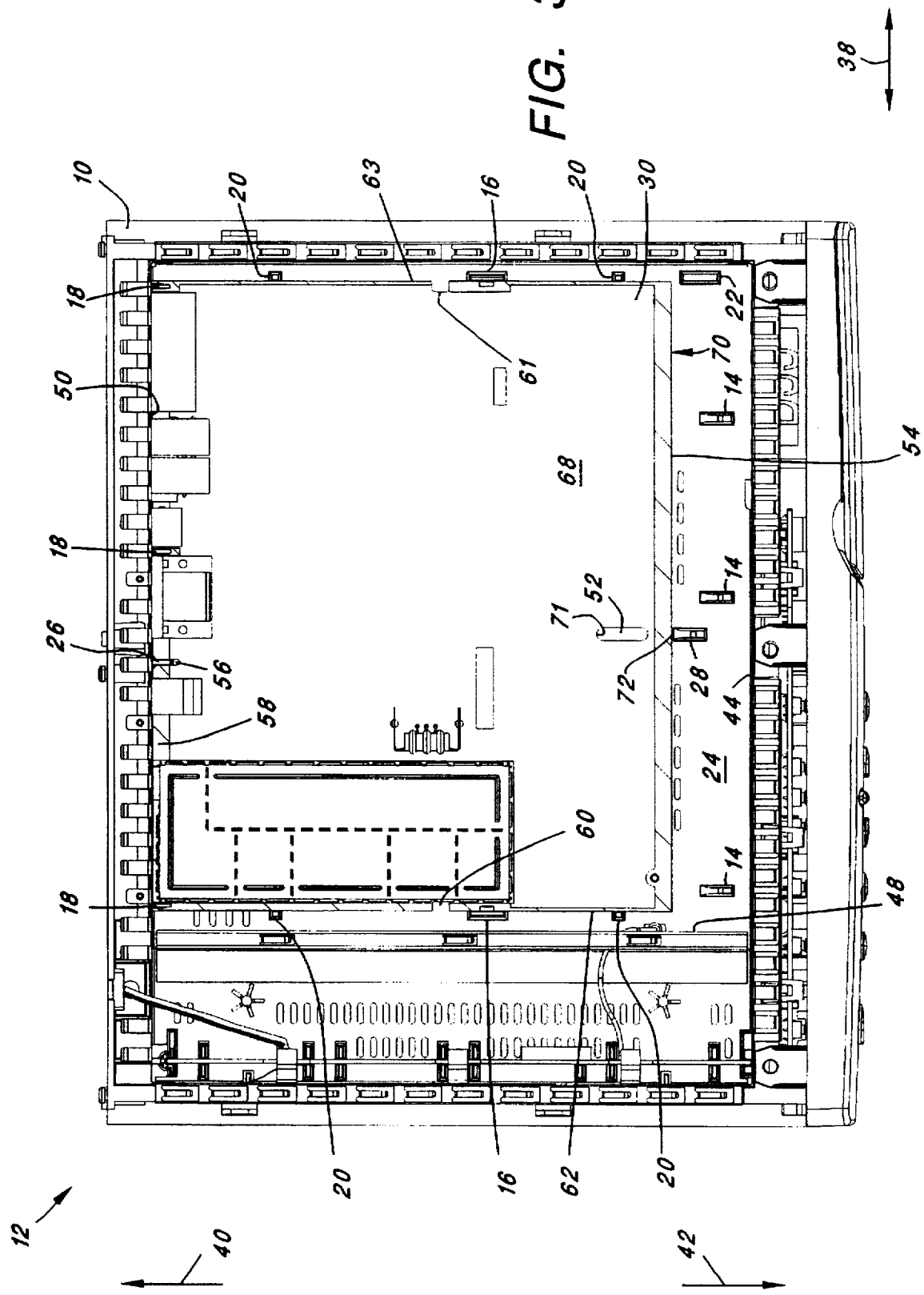

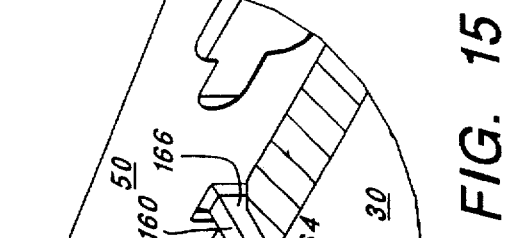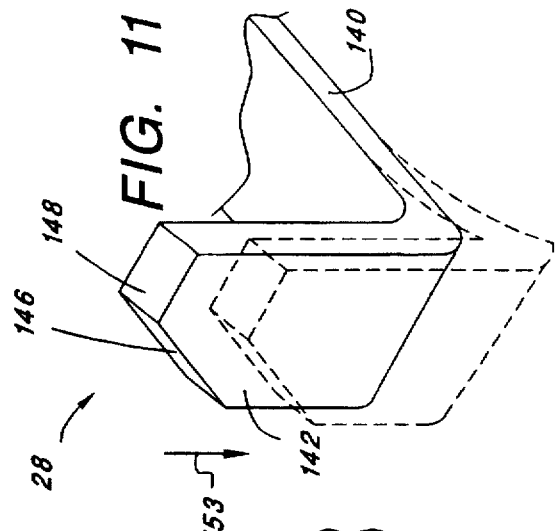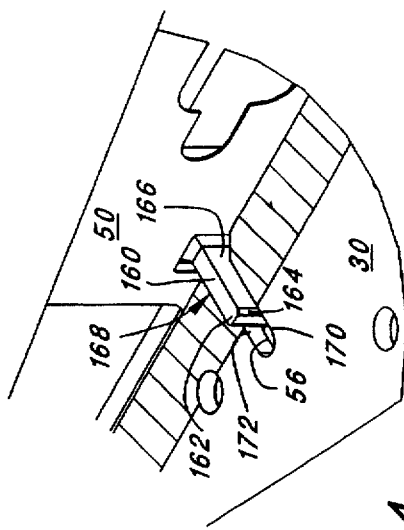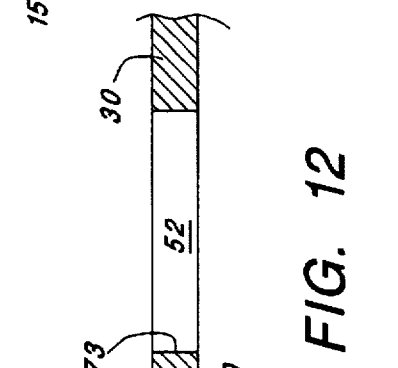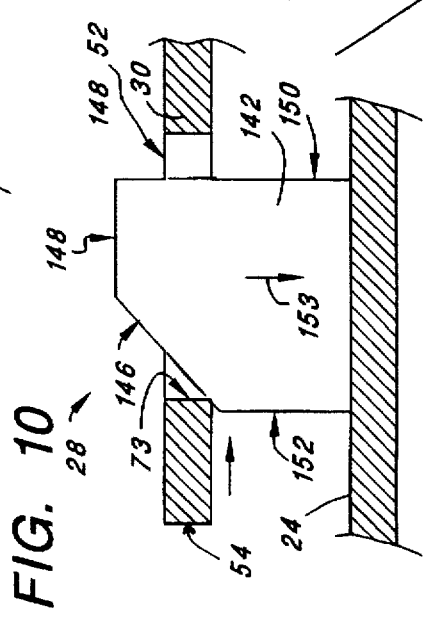

ELECTRONIC ASSEMBLY CIRCUIT BOARD INSTALLATION APPARATUS

BACKGROUND OF THE INVENTION

This invention relates to circuit board mounting and installation schemes for electronic assemblies and more particularly to an arrangement of circuit board guides and retainers within an electronic assembly to facilitate the alignment and installation of a circuit board.

Conventional methods for alignment and installation of a circuit board within an electronic assembly typically involve a multi-step process including a first step of placing the circuit board in an aligned orientation within the electronic assembly by the installation personnel. The next step typically involves making the appropriate connections, both electrical and mechanical, between the circuit board and various elements of the electronic assembly housing structure followed by the step of positively retaining the circuit board in place with screws, clamps, springs clips and other small piece parts.

Proper alignment and insertion of a circuit board by the installation personnel in these conventional installation techniques is a prerequisite to completing the assembly and installation process. If the circuit board is misaligned ever so slightly, the subsequent circuit board connections and retentions are either difficult to make and/or have a higher probability of failure. Furthermore, a misaligned circuit board is more susceptible to damage during the remaining steps of the assembly process for the electronic assembly.

Thus, care must be exercised during installation of circuit boards so as to ensure proper alignment of the board as well as to prevent bending or other damage to the circuit board which in turn may result in eventual failure. This is especially true where the electronic assembly is a relatively small assembly. An obviously misaligned board must be removed and the alignment and installation process re-initiated. The additional care required by installation personnel to align circuit boards often translates into additional time and labor, the costs of which are ultimately incorporated into the finished product.

Thus, there is a need for an improved apparatus and technique to facilitate the alignment and installation of a circuit board within an electronic assembly that is relatively inexpensive and simple to use. Preferably the alignment and installation apparatus should be fully integrated with the electronic assembly housing structure thus eliminating the common problems associated with handling, installation, and replacement of small piece parts such as circuit board clips, circuit board clamps and the like.

Furthermore, there is a continuing need for a simple technique for the alignment and installation of a circuit board within an electronic assembly housing that can be accomplished without requiring much assembly time and effort and that can be accomplished with a minimized risk of damaging the circuit board or other components of during the assembly of the electronic device.

SUMMARY OF THE INVENTION

The present invention advantageously addresses the above and other needs by providing a circuit board guide and retaining apparatus to facilitate the alignment and installation of a circuit board within an electronic assembly chassis. The circuit board guide and retaining apparatus includes a combination of alignment structures for aligning the circuit board in a prescribed orientation parallel to the base of the electronic assembly chassis and a plurality of retention structures for preventing the circuit board from substantial displacement in lateral and/or vertical directions during and after the installation of the circuit board.

The alignment structures of the disclosed embodiments include one or more circuit board guiding ramps disposed on the base of the electronic assembly chassis and adapted to receive an edge of the circuit board and align the circuit board in a parallel orientation to the base of the electronic assembly chassis. Alternatively or conjunctively, the present embodiment of the invention includes a plurality of voids in the circuit board including an interior alignment slot, an alignment channel, and alignment notches each of which cooperate with various retention structures or protrusions extending from the electronic assembly chassis.

The retention structures of the circuit board guide and retaining apparatus include some or all of the following structures: a pair of oppositely facing lateral retaining assemblies, one or more vertical guide and retention assemblies, a plurality of side guiding posts, an alignment peg, and a deflecting mechanism. The selected structures are disposed in a preselected arrangement on the base of the electronic assembly chassis. During and after the installation process, the lateral retaining assemblies and side guiding posts essentially function to prevent displacement of the circuit board in both lateral directions. In addition, the lateral retaining assemblies and the vertical guide and retention assemblies as well as the side guiding posts function to prevent substantial displacement in the vertical directions. Finally, after the circuit board is installed, the deflecting lever locks the circuit board in place, thus restraining the circuit board in all six directions.

Other features of the invention will be apparent from the following more detailed description of the preferred embodiments, taken in conjunction with the accompanying drawings, which illustrate, by way of example, the principles of the present invention.

BRIEF DESCRIPTION OF THE DRAWINGS

In the following detailed description, reference will be made to the attached drawings in which:

FIG. 3 is another top view of an electronic assembly chassis of FIG. 1 shown with the circuit board securely installed further illustrating the cooperative arrangement between the circuit board and several elements of the present guide and retaining apparatus;

FIG. 10 is an enlarged isometric view of the side guiding post of FIGS. 4 and 5;

FIG. 11 is an enlarged isometric view of the rear deflecting lever of FIG. 1;

FIG. 12 is a sectional view of the rear deflecting lever and circuit board of FIG. 2 illustrating the cooperative arrangement between the rear deflecting lever and the alignment slot of the circuit board;

FIG. 13 is another sectional view of the rear deflecting lever and circuit board of FIG. 3 illustrating the locking arrangement between the rear deflecting lever and the circuit board;

FIG. 14 is an enlarged isometric view of the circuit board alignment peg of FIG. 3 shown prior to engagement with the alignment channel of the circuit board; and FIG. 15 is an enlarged isometric view of the circuit board alignment peg of FIG. 3 shown engaging the alignment channel of the circuit board.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
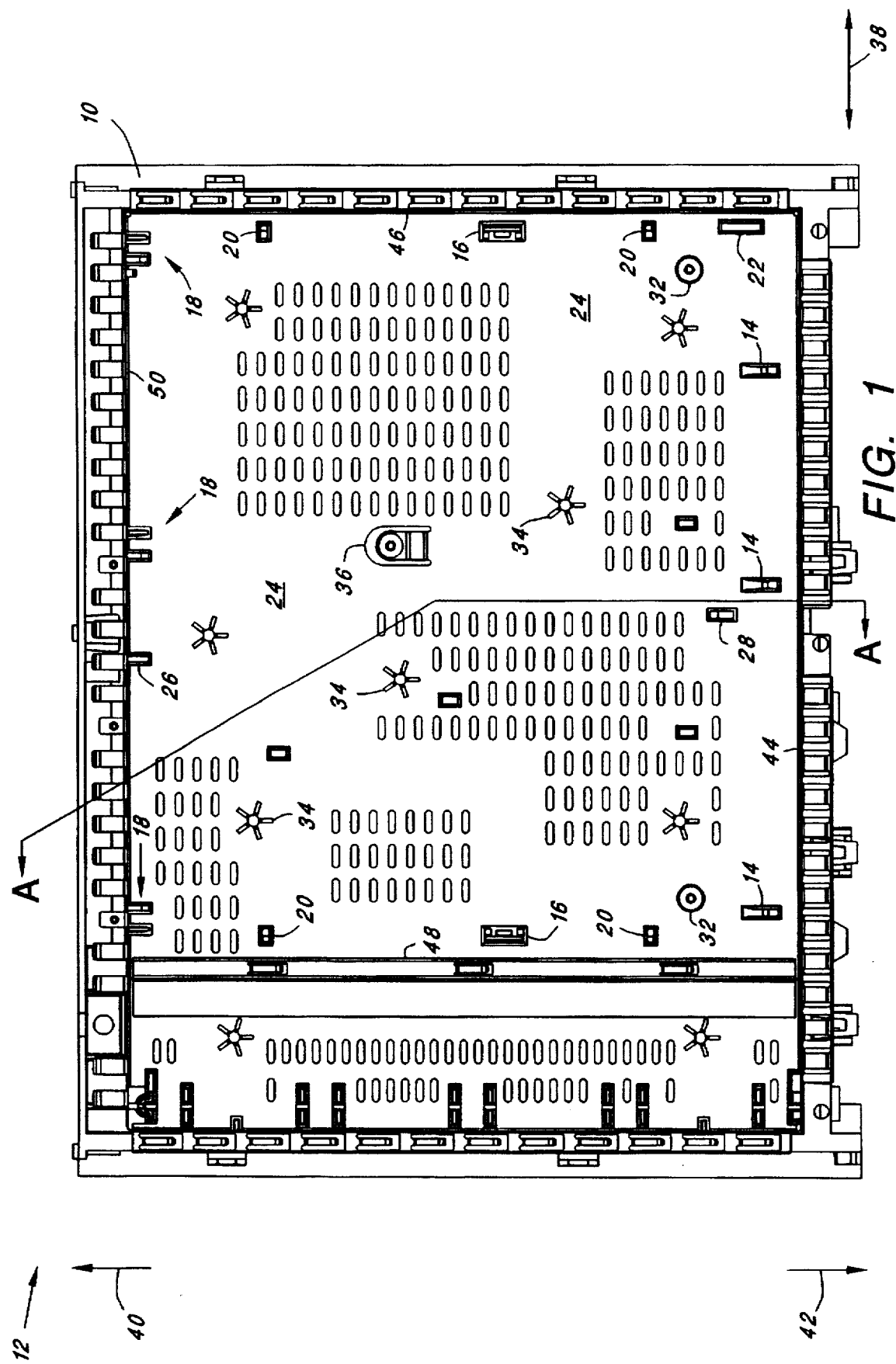
FIG. 1 is a top view of an electronic assembly chassis shown with the circuit board guide and retaining apparatus in accordance with the present invention.
Figure 2:
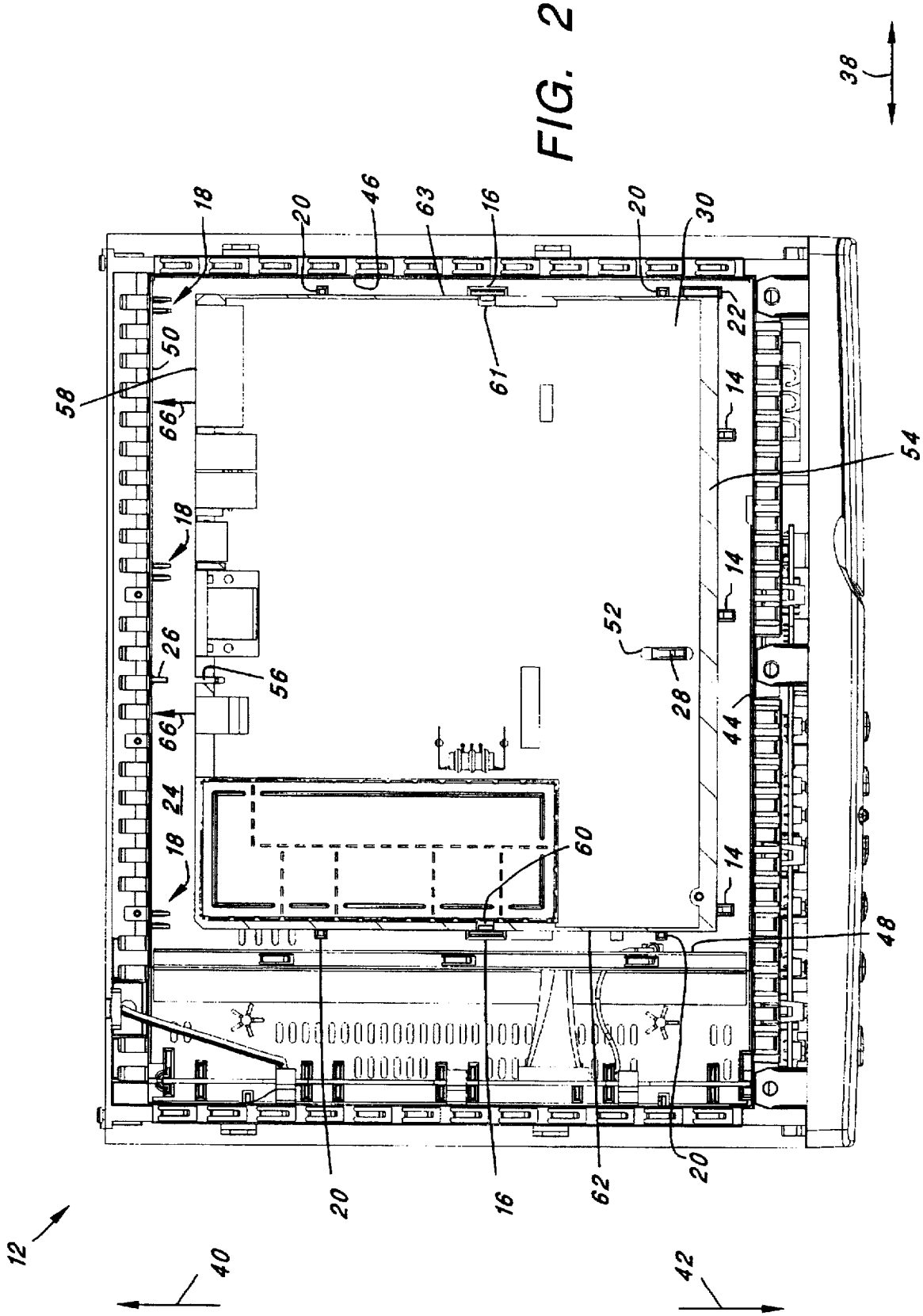
FIG. 2 is a top view of an electronic assembly chassis of FIG. 1 shown with the initial alignment of the circuit board illustrating the cooperative arrangement between the inserted circuit board and the circuit board guide and retaining apparatus.

Referring now to the drawings, and particularly to FIGS. 1 through 3, there is shown various views of an electronic assembly chassis 10 incorporating the preferred embodiment of the circuit board guide and retaining apparatus 12. As seen in FIG. 1, the illustrated embodiment of the circuit board guide and retaining apparatus 12 includes three aligned circuit board guiding ramps 14, a pair of oppositely facing lateral retaining assemblies 16, three vertical guide and retention assemblies 18, four side guiding posts 20 and a reference wall 22 all disposed on a base 24 of the electronic assembly chassis 10. The illustrated embodiment of the circuit board guide and retaining apparatus 12 further includes an alignment peg 26, and a deflecting lever 28 used to lock the circuit board 30 in place after installation. FIG. 1 also depicts various base supports 32, shield retainers 34, and a grounding platform 36 that are typically found in many electronic assemblies.

Before describing the details associated with the illustrated circuit board guide and retaining apparatus, it may be helpful to provide an explanation of several terms used herein. The term "alignment" refers to the initial placement or insertion of the circuit board within the electronic assembly chassis and in the proper orientation relative to the electronic assembly chassis. The term "installation" refers to the subsequent movement, engagement and/or retention of the circuit board in the prescribed operating configuration.

Continuing with the definition of terms, for purposes of describing the illustrated embodiments of the circuit board guide and retaining apparatus the term "vertical" refers to a direction normal to base of the electronic assembly chassis. The term "lateral" refers to a direction along the base of the electronic assembly chassis between a first side of the electronic assembly chassis and the opposite side of the electronic assembly chassis. For purposes of this detailed description, the "lateral" directions are identified by arrow 38 in FIGS. 1 through 3. Finally, for purposes of this detailed description, the directional term "forward" refers to the direction identified by arrow 40 in FIGS. 1 through 3 while the directional term "backward" refers to the direction identified by arrow 42 in FIGS. 1 through 3. The scope of the invention, however, as determined with reference to the claims, is not so limited to the directional limitations identified in the drawings and associated description.

Referring back to the FIG. 1 of the drawings, it is seen that the three aligned circuit board guiding ramps 14 are generally extending upright from the base 24 of the electronic assembly chassis 10 near the rear wall 44 of the electronic assembly chassis 10. The pair of oppositely facing lateral retaining assemblies 16 are also extending upright from the base 24 of the electronic assembly chassis 10 but are disposed proximate a first side wall 46 and an interior side wall 48 of the electronic assembly chassis 10. The three vertical guide and retention assemblies 18 are preferably disposed against the forward wall 50 of the electronic assembly chassis 10. The side guiding posts 20 are preferably arranged in pairs of oppositely facing projections extending upright from the base 24 of the electronic assembly chassis 10 near the side walls 46, 48. As seen in FIG. 1, the side guiding posts 20 proximate either side wall are generally linearly aligned in a horizontal (i.e., forward-backward) direction with one of the lateral retaining assemblies 16. The illustrated embodiment also includes a reference wall 22 disposed in a rear corner which is used for lateral alignment in conjunction with guiding ramps 14, as more fully described below. Lastly, the alignment peg 26 is shown extending from the forward wall 50 of the electronic assembly chassis 10 while the deflecting lever 28 is located opposite the alignment peg 26 near the rear wall 44 and just forward of the aligned guiding ramps 14.

The operation of the present circuit board guide and retaining apparatus 12 is best described in terms of a three step method for aligning and installing a circuit board within an electronic assembly chassis. Starting with an electronic chassis 10 illustrated in FIG. 1, complete with the alignment structures and retention structures described above, a circuit board is placed therein from above. A rear edge of the circuit board is first inserted into the electronic assembly chassis 10 and is placed against the guiding ramps 14. Concurrently a side edge of the circuit board is placed against the reference wall 22 to ensure proper lateral alignment. The forward edge of the circuit board is then rotated downward and dropped into the electronic assembly chassis 10 in a prealigned orientation, resulting from the guiding ramps 14 and reference wall 22. As more fully described in the following paragraphs, the retention structures, such as the side guiding posts 20, lateral retaining assemblies 16 and rear retaining lever 28, are arranged to cooperate with the circuit board in its prealigned position. The final step involves pushing the circuit board in a forward direction until the rear deflecting lever 28 locks the circuit board in place completing the installation. The details associated with the final step are more fully described below.

FIG. 2 illustrates the cooperative arrangement between a circuit board 30 and various elements of the circuit board guide and retaining apparatus 12. In particular, FIG. 2 depicts the initial alignment or placement of the circuit board 30 within the electronic assembly chassis 10. Of particular importance to the initial placement of the circuit board 30 in the electronic assembly chassis 10, in the presently illustrated embodiment, are several features of the circuit board 30. Namely, the circuit board 30 includes an interior alignment slot 52 proximate a rear edge 54 of the circuit board 30, an alignment channel 56 proximate a forward edge 58 of the circuit board 30, and alignment notches 60, 61 on side edges 62, 63 of the circuit board 30. As seen in FIG. 2, the rear edge 54 of the circuit board 30 is initially buttressed against a forward facing surface 64 of the circuit board guiding ramps 14. In addition, a side edge 63 of the circuit board is placed in abutting relation with the reference wall 22 while the alignment notches 60, 61 in both side edges 62, 63 of the circuit board 30 are aligned with and further cooperate with respective lateral retaining assemblies 16. Finally, the initial placement of the circuit board 30 within the electronic assembly chassis 10 finds the deflecting lever 28 extending through the interior alignment slot 52 in the circuit board 30. Once aligned or placed within the electronic assembly chassis 10, the circuit board 30 is then installed by moving the circuit board 30 in a forward direction along a plane parallel to the base 24 of the electronic assembly chassis indicated by arrow 66.

FIG. 3 further illustrates the cooperative arrangement between the circuit board 30 and various elements of the circuit board guide and retaining apparatus 12 after installation. As seen in FIG. 3, the side edges 62, 63 of the circuit board 30 remain in an abutting relation with the corresponding side guiding posts 20 and lateral retaining assembly 16. Also, the rear edge 54 of the circuit board 30 is positively restrained by the forward facing surface 72 of the deflecting lever 28. The forward edge 58 of the circuit board 30 is situated in an abutting relation with the forward wall 50 of the electronic assembly chassis 10 while the alignment peg 26 is engaged with the alignment channel 56. Although not clearly shown in FIG. 3, the upper surface 68 and lower surface 70 of the circuit board 30 are appropriately engaged with the vertical guide and retention assemblies 18 at the forward wall 50 of the electronic assembly chassis 10.

Referring again to FIGS. 2 and 3, it is seen that as the illustrated circuit board 30 moves in the forward direction 40 the alignment notches 60, 61 are no longer adjacent to the corresponding lateral retaining assemblies 16. Such forward movement results in the circuit board 30 being positively restrained from substantial displacement in at least four of the six possible directions. For example, the lateral retaining assemblies 16, alignment peg 26, and side guiding posts 20 essentially prevent displacement of the circuit board 30 in both lateral directions. Also, the lateral retaining assemblies 16 together with the vertical guide and retention assemblies 18 prevent substantial displacement of the circuit board 30 in the upward vertical direction. Similarly, the lateral retaining assemblies 16, vertical guide and retention assemblies 18, and side guiding posts 20 function to prevent displacement of the circuit board 30 in the downward direction. Finally, the forward surface 72 of the deflecting lever 28 prevents substantial displacement of the circuit board 30 in the backward direction 42 prior to installation by engaging the interior edge 71 of the alignment slot 52 if the circuit board 30 were to be moved in a backward direction 42. After the circuit board 30 is fully installed, the displacement lever 28 locks the circuit board 30 in place and prevents displacement in the forward or backward directions. Thus through the operation of the retention structures, the circuit board 30 is restrained from movement in all six directions.

Figure 4:
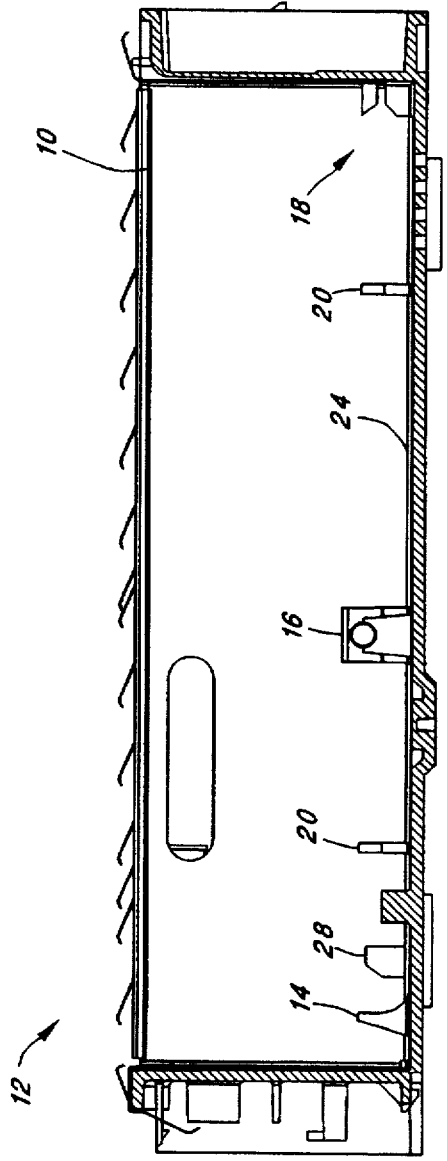
FIG. 4 is a sectional view of the electronic assembly chassis of FIG. 1 taken along line A—A illustrating elements of the circuit board guide and retaining apparatus.
Figure 5:
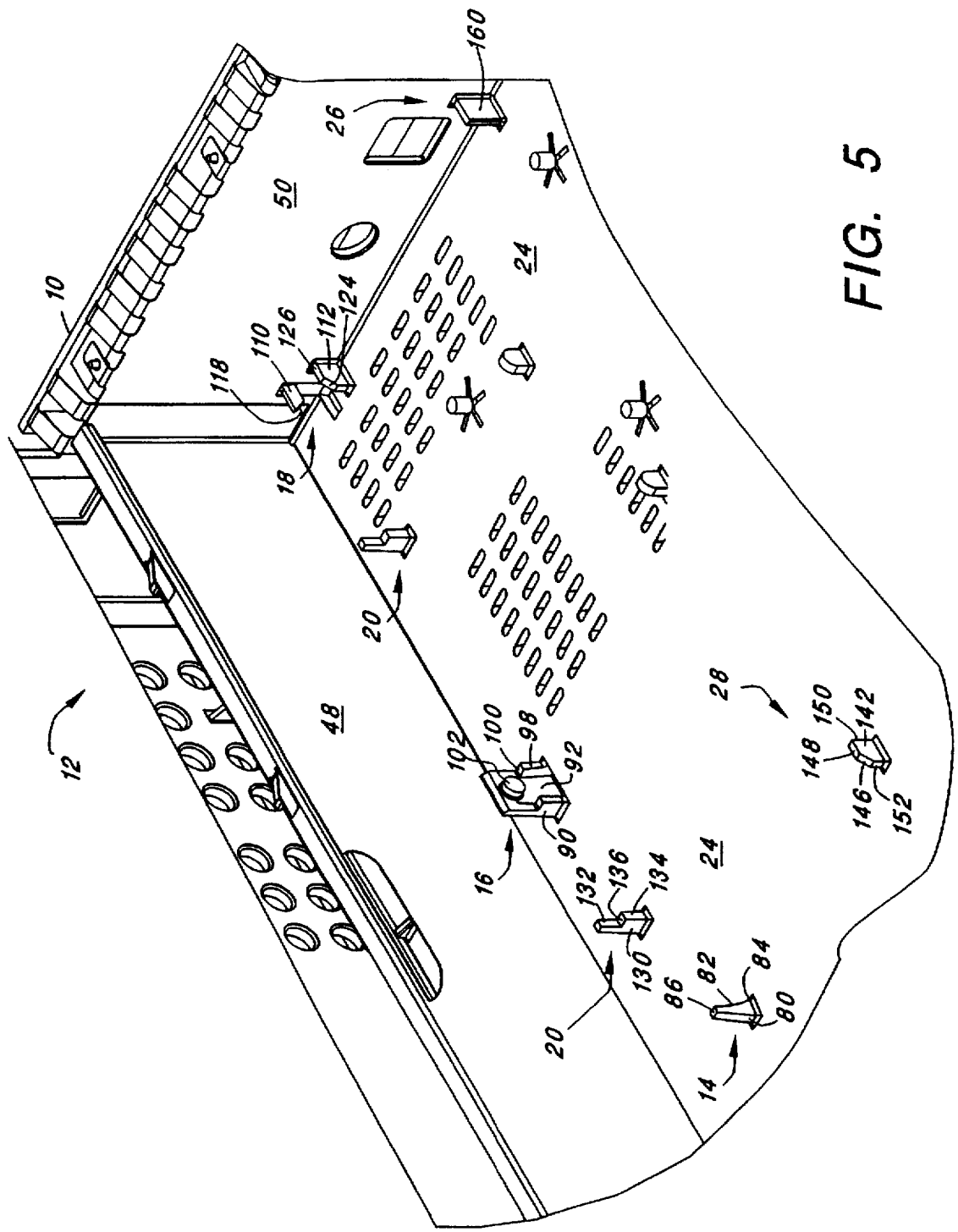
FIG. 5 is a partial isometric view of the electronic assembly chassis of FIG. 1 illustrating elements of the circuit board guide and retaining apparatus.

Turning now to FIGS. 4 through 15, a more detailed view of the various elements that comprise the circuit board guide and retaining apparatus 12 is presented. Specifically, FIGS. 4 and 5 present different views of the combination of a circuit board guide ramp 14, a lateral retaining assembly 16, a vertical guide and retention assembly 18, a pair of side guiding posts 20, the alignment peg 26, and deflecting lever 28 used in the preferred embodiment of the invention together with the relative placement thereof within an electronic assembly chassis 10. FIGS. 6 through 15 are detailed views of the individual components of the circuit board guide and retaining apparatus.

Figure 6:
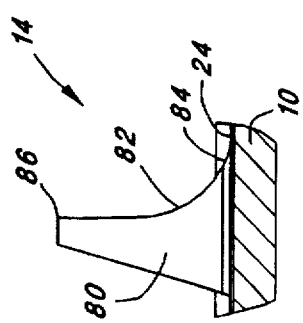
FIG. 6 is an enlarged side view of the circuit board guiding ramp of FIGS. 4 and 5.

The circuit board guiding ramp 14 illustrated in FIGS. 4, 5, and 6 includes at least one upright fixture 80 disposed at a preselected location on the base 24 of the electronic assembly chassis 10. The guiding ramp fixture 80 has a forward facing arcuate or curved surface 82 and a forward edge 84 or lip. The curved surface 82 is preferably a generally concave surface whose orientation proximate the forward facing edge 84 is generally tangential with the base 24 of the electronic assembly chassis 10. Conversely, the orientation of the arcuate surface 82 near the top edge 86 of the arcuate surface 82 is generally perpendicular to the base 24 of the electronic assembly chassis 10. In operation, the forward facing arcuate surface 82 of the guiding ramp fixture 80 is adapted to receive a rear edge 54 of the circuit board and guide the circuit board to a prescribed position within the electronic assembly chassis 10 proximate the upright ramp fixture 80 and in a generally parallel orientation to the base 24 of the electronic assembly chassis 10. In other words, the guiding ramp fixture 80 provides an easy and smooth transition of the circuit card from the initial vertical insertion orientation to an orientation that is parallel to the base of the electronic assembly chassis. In addition, the guiding ramp fixture 80 is adapted to align the circuit board within a plane parallel to the base 24 by ensuring that the rear edge of the circuit board is disposed parallel with the forward edge 84 of the guiding ramp fixture 80. The dimensions of the circuit board guiding ramp 14, including height, width, length, curvature, as well as the general configuration of the circuit board guiding ramp 14 can be tailored for the specific application in which it is used. While the illustrated embodiment contemplates the use of three circuit board guiding ramps, more or less ramps of varying size can easily be substituted without affecting the function of the guiding ramp.

Turning now to the lateral retaining assembly 16 illustrated in FIGS. 4, 5, 7, and 8, it is seen that such assembly 16 includes a rigid retaining wall 90 extending in an upright orientation from the base 24 of the electronic assembly chassis 10. The interior facing surface 92 of the retaining wall 90 is the surface against which the side edges of the circuit board abut. The retaining wall 90 is comprised of an upper section 94 and a lower section 96, with the lower section 96 including one or more laterally extending ledges 98. The ledges 98 have an exposed surface that is oriented parallel to the base 24 of the electronic assembly chassis 10. As illustrated, the exposed surface 100 is adapted to provide vertical support for a circuit board.

The upper section 94 of the lateral retaining assembly 16 includes a laterally extending circular nub 102 or projection, the lower radial surface 104 of which is dimensioned to engage the upper surface of the circuit board. The laterally extending nub 102 is further dimensioned to fit within the above-described alignment notches on the sides of the circuit board thus allowing the circuit board to be inserted into the lateral retaining assembly 16 from above (i.e. in the vertical direction) rather than from a horizontal plane parallel to the base 24 of the electronic assembly chassis 10. Moreover, since the preferred electronic assembly chassis 10 is made as a one piece construction item, there is little or no room along the horizontal plane (i.e. forward-backward direction) in which to insert the circuit board. Thus, the vertical insertion of the circuit board is preferred because it facilitates the efficient use of space within the electronic assembly chassis 10.

Figure 8:
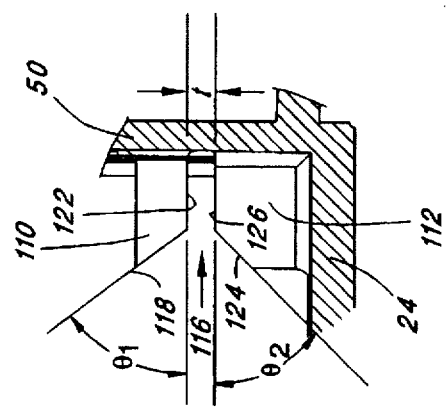
FIG. 8 is a sectional view of the lateral retaining assembly of FIG. 7 taken along line B—B.

As further seen in FIG. 8, the interior surface 92 of the retaining wall 90 together with the exposed surface 100 of the ledge 98 and the lower radial surface 104 of the nub 102 collectively define a retaining channel 106 that is approximately equal to the thickness, t, of the circuit board and otherwise dimensioned to receive and retain the circuit board. During and after the installation process, the exposed surface 100 of the ledge 98 prevents localized displacement of the circuit board in the downward (i.e. vertical) direction while the radial surface 104 of the circular nub 102 inhibits localized displacement of the circuit board in the upward (vertical) direction. In addition, the retaining wall 90 prevents the circuit board from displacement in a lateral direction.

Figure 9:
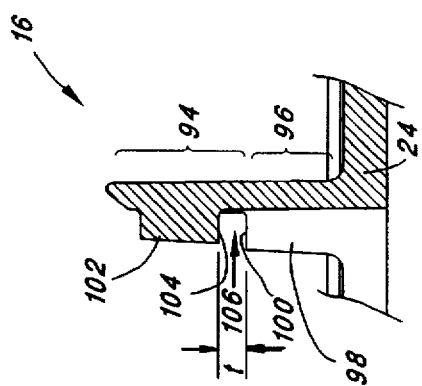
FIG. 9 is an enlarged side view of the vertical guide and retention assembly of FIGS. 4 and 5.
Figure 7:
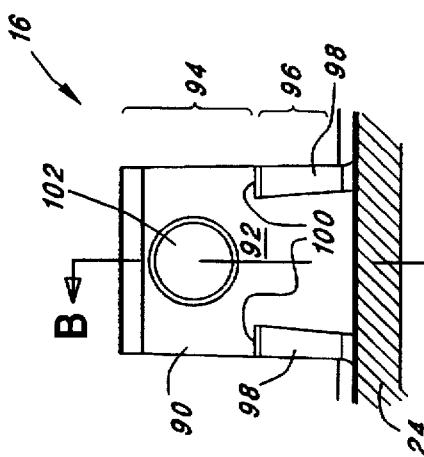
FIG. 7 is an enlarged side view of the lateral retaining assembly of FIGS. 4 and 5.

Referring next to FIGS. 4, 5, and 9, there is shown detailed views of a vertical guide and retention assembly 18. The illustrated vertical guide and retention assembly 18 is adapted for both guiding the circuit board into the forward installed position while concurrently engaging the upper and lower surfaces of the circuit board thereby restraining the circuit board from substantial displacement in either vertical direction. Specifically, the illustrated vertical guide and retention assembly 18 includes an upper retaining tab 110 extending from the forward wall 50 and a lower retaining tab 112 extending from the forward wall 50 and the base 24 of the electronic assembly chassis 10. The placement of the upper retaining tab 110 and lower retaining tab 112 with respect to one another is designed to create lateral and vertical spacings 116 between the upper retaining tab 110 and the lower retaining tab 112.

The important features of the upper retaining tab 110 is that it has an angled guiding surface 118 at its distal 120 end as well as a horizontal retaining surface 122. The angled guiding surface 118 has a prescribed deflecting angle $\theta_1$ for guiding the forward edge of the circuit board into the defined vertical spacing 116 between the upper and lower retaining tabs 110, 112. The horizontal retaining surface 122 faces the defined vertical spacing 116 and is adapted for engaging the upper surface of the circuit board.

Similarly, the lower retaining tab 112 also has an angled guiding surface 124, at an angle $\theta_2$, for guiding the circuit board into the defined vertical spacing 116 between the upper and lower retaining tabs 110, 112. The lower retaining tab 112 also has a horizontal retaining surface 126 adapted for engaging the lower surface of the circuit board when properly installed. Collectively, the upper retaining tab 110 and the lower retaining tab 112 act to exert a restraining force on the circuit board to inhibit and/or prevent displacement in the vertical direction.

Referring next to FIGS. 4, 5, and 10, there is shown detailed views of a side guiding post 20 which extends in a vertical or upright direction from the base 24 of the electronic assembly chassis 10. The side guiding post 20 is comprised of two rigid sections including a relatively wide base section 130 and a narrow upper post section 132 extending upward therefrom. The dimensional difference between the upper section 132 and lower section 130 defines a laterally extending ledge 134 formed at the junction of the base section 130 and upper post section 132. This ledge 134 provides a support surface 136 upon which the lower surface of the circuit board rests when fully installed. The narrow upper post section 132 of the side guiding post 20 has a guiding surface 138 against which the side edges of the circuit board contact during the installation thereof.

Turning to FIGS. 5, and 11 through 13, there is shown detailed views of the deflecting lever 28 for retaining or locking the circuit board in a prescribed position along the base 24 of the electronic assembly chassis 10. As seen most clearly in FIG. 11, the deflecting lever 28 includes a cantilevered platform 140 disposed in a co-planar orientation with the base of the electronic assembly chassis and has a projection 142 at the free end of the cantilevered platform 140 that extends in an upright orientation normal to the base 24 of the electronic assembly chassis 10. The projection 142 is aligned with and preferably extends through the interior slot in the circuit board during the initial placement of the circuit board. The projection 142 has a top surface, that has a ramp 146 that is inclined at a prescribed angle leading to a horizontal surface 148. The projection 142 also includes a forward facing vertical surface 150 and a rear facing vertical surface 152.

As seen in FIGS. 12 and 13, the deflecting lever 28 is adapted to deflect in a downward orientation, designated by arrow 153 when an edge 73 of the circuit board 30 engages the ramp 146 thereby allowing the circuit board 30 to slide over the top surface 146, 148 of the projection 142 in a forward direction. However, the projection 142 returns to its original upright position after the trailing edge 54 of the circuit board 30 slides past the top surface 146, 148 of the projection 142. As it returns to its original upright position, the forward facing vertical surface 150 of the projection 142 engages the trailing edge 54 of the circuit board 30 thereby preventing the circuit board from traversing or sliding over the top surface of the projection 142 in a backward direction.

Finally, FIGS. 14 and 15 show detailed views of the alignment peg 26 in operative association with the alignment channel 56 on the circuit board 30. The alignment peg 26 is a rigid structure 160 that extends from the forward wall 50 of the electronic assembly chassis 10 and is dimensioned to slidingly engage with the alignment channel 56 of the circuit board 30 as the circuit board is moved in the forward direction. The distal end 162 of the alignment peg 26 has angled surfaces 164 to help guide the alignment peg with the alignment channel as the circuit board 30 is moved into position. The alignment peg 26 also has a pair of side surfaces 166, 168 that engage corresponding side edges of the alignment channel 170, 172. Once engaged, the alignment peg 26 inhibits localized displacement of the circuit board 30 in either lateral direction. Full engagement of the alignment peg 26 with the alignment channel 56 occurs concurrently with the deflecting lever 28 engaging the rear edge of the circuit board thereby locking the circuit board in place.

The present invention and its advantages will be understood from the foregoing description, and it will be apparent that numerous modifications and variations could be made thereto without departing from the spirit and scope of the invention or sacrificing all of its material advantages, the forms hereinbefore described being merely exemplary embodiments thereof. For example the number, configuration, dimensions, and placement of the above-described elements can be modified for the specific application in which they are used and are dependent on the circuit board type, size, and other performance requirements including shock and vibration specifications. To that end, it is not intended that the scope of the invention be limited to the specific embodiments illustrated and described. Rather, it is intended that the scope of this invention be determined by the appending claims and their equivalents.

What is claimed is:

1. A circuit board guide and retaining apparatus comprising:

an electronic assembly chassis having a base;

a circuit board having an upper surface, and a pair of side edges, said circuit board having an alignment notch on at least one of said side edges;

alignment structures disposed on said base of said electronic assembly chassis aligning said circuit board within said electronic assembly chassis and in a prescribed orientation parallel to said base of said electronic assembly chassis; and a plurality of retention structures extending from said base of said electronic assembly chassis, said retention structures retaining said circuit board in a prescribed position within said electronic assembly chassis and preventing displacement of said circuit board in one or more prescribed directions during and after the installation of said circuit board, said retention structures including a retaining assembly disposed on said base of said electronic assembly chassis and cooperating with said alignment notch on said at least one of said side edges when said circuit board is aligned within said electronic assembly chassis and further engaging at least one of said side edges, thereby restraining said circuit board from sustained displacement in the lateral direction, and also further engaging said upper surface when said circuit board is installed, thereby restraining said circuit board from substantial displacement in the vertical direction, wherein said side retaining assembly is an upright rigid projection having a lateral retaining wall extending from said base of said electronic assembly chassis, a ledge laterally extending from a lower section of said lateral retaining wall, and a nub laterally extending from a upper section of said lateral retaining wall, the arrangement of said nub, said lateral retaining wall, and said ledge defining a retaining channel which receives and retains said circuit board in the lateral and vertical directions.

2. The circuit board guide and retaining apparatus of claim 1 wherein said alignment structures aligning said circuit board comprise one or more circuit board guiding ramps disposed on said base of said electronic assembly chassis and receiving rear edge of said circuit board and align said circuit board in a prescribed orientation parallel to said base of said electronic assembly chassis.

3. The circuit board guide and retaining apparatus of claim 2 wherein said circuit board guiding ramp is an upright fixture disposed at a preselected location on said base of said electronic assembly chassis, said circuit board guiding ramp having a forward facing arcuate surface, a forward edge of which is tangential to said base of said electronic assembly chassis, said forward facing arcuate surface of said circuit board guiding ramp receiving said rear edge of said circuit board as said circuit board is placed within said electronic assembly chassis and align said circuit board proximate said preselected location and in a parallel orientation to said base of said electronic assembly chassis.

4. The circuit board guide and retaining apparatus of claim 1 wherein said circuit board further includes an interior alignment slot proximate a rear edge of said board, an alignment channel proximate a front edge of said circuit board, and alignment notches on side edges of said circuit board, said alignment structures further include one or more protrusions extending from said electronic assembly chassis aligning with at least one of said alignment channel, said alignment notches, said interior alignment slot and said side edges of said circuit board thereby aligning said circuit board in a prescribed orientation within said electronic assembly chassis.

5. The circuit board guide and retaining apparatus of claim 1 wherein said plurality of retention structures includes one or more vertical guide and retention assemblies extending from a forward wall of said electronic assembly chassis and guiding said circuit board into a final position while concurrently engaging said upper surface and a lower surface of said circuit board thereby restraining said circuit board from substantial displacement in a vertical direction.

6. The circuit board guide and retaining apparatus of claim 5 wherein said vertical guide and retention assembly further includes an upper retaining tab and a lower retaining tab with a defined spacing therebetween, said upper retaining tab extending from said forward wall of said electronic assembly chassis and having an angled guiding surface guiding said circuit board into said defined spacing between said upper and lower retaining tabs and further having a first retaining surface facing said defined spacing engaging said upper surface of said circuit board, said lower retaining tab extending from said forward wall of said electronic assembly chassis and also having an angled guiding surface guiding said circuit board into said defined spacing between said upper and lower retaining tabs and further having a second retaining surface facing said defined spacing engaging said lower surface of said circuit board such that, in conjunction with said first retaining surface, the second retaining surface restrains said circuit board in a vertical direction.

7. The circuit board guide and retaining apparatus of claim 1 further including one or more side guiding posts disposed on said base of said electronic assembly chassis and guiding said side edges of said circuit board during alignment and installation of said circuit board, said guiding posts further having a small ledge providing support to a lower surface of said circuit board.

8. The circuit board guide and retaining apparatus of claim 1 wherein said circuit board includes an interior alignment slot proximate a rear edge of said circuit board and an alignment channel proximate a front edge of said circuit board, said retention structures further include:

a rear deflecting lever disposed on said base of said electronic assembly chassis and projecting through said slot in said circuit board when said circuit board is aligned within said electronic assembly chassis and further engaging said rear edge of said circuit board when fully installed thereby restraining said circuit board from moving in a backward direction; and an alignment peg extending from a forward wall of said electronic assembly chassis and engaging with said alignment channel of said circuit board thereby preventing said circuit board from further sliding in a lateral direction.

9. The circuit board guide and retaining apparatus of claim 1 wherein said circuit board includes an interior alignment slot proximate a rear edge of said circuit board and an alignment channel proximate a front edge of said circuit board, said circuit board guide and retaining apparatus further including:

a rear deflecting lever disposed on said base of said chassis and projecting through said slot in said circuit board when said circuit board is aligned within said chassis and further engaging said rear edge of said circuit board when fully installed thereby restraining said circuit board from moving in a backward direction; and an alignment peg extending from a forward wall of said chassis and engaging with said alignment channel of said circuit board thereby preventing said circuit board from further sliding in a lateral direction.

10. A circuit board guide and retaining apparatus comprising:

an electronic assembly chassis having a base;

a circuit board having an upper surface and a lower surface, an interior slot proximate a rear edge of said circuit board, an alignment channel proximate a front edge of said circuit board, and alignment notches on side edges of said circuit board;

one or more circuit board guiding ramps disposed on said base of said electronic assembly chassis and receiving a rear edge of said circuit board thereby aligning said circuit board within said electronic assembly chassis;

one or more lateral retaining assemblies disposed on said base of said electronic assembly chassis and cooperating with said alignment notches in said side edges of said circuit board when said circuit board is aligned within said electronic assembly chassis and further engaging each side edge of said circuit board and said upper surface of said circuit board when fully installed thereby restraining said circuit board from substantial displacement in the lateral and vertical directions;

one or more vertical guide and retention assemblies extending from a forward wall of said electronic assembly chassis and guiding said circuit board into a final position and engaging said upper and lower surfaces of said circuit board further restraining said circuit board from substantial displacement in a vertical direction;

a rear deflecting lever disposed on said base of said electronic assembly chassis and projecting through said slot in said circuit board when said circuit board is aligned within said electronic assembly chassis and further engaging said rear edge of said circuit board when fully installed thereby restraining said circuit board from moving in a backward direction; and a circuit board alignment peg extending from said forward wall of said electronic assembly chassis and engaging with said alignment channel of said circuit board thereby preventing said circuit board from further sliding in a lateral direction.

11. The circuit board guide and retaining apparatus of claim 10 further comprising one or more side guiding posts disposed on said base of said electronic assembly chassis and guiding said side edges of said circuit board during alignment and installation of said circuit board and further provide support to said lower surface of said circuit board when fully installed.

12. A circuit board guiding ramp for aligning a circuit board comprising:

an electronic assembly chassis;

an upright fixture disposed at a preselected location on a base of said electronic assembly chassis, said fixture having a forward facing arcuate surface and a forward edge, a slope of said forward facing arcuate surface proximate said forward edge being tangential to said base of said electronic assembly chassis, said forward facing arcuate surface of said upright fixture receiving an edge of a circuit board as said circuit board is placed within said electronic assembly chassis and guided said circuit board to a prescribed position within said electronic assembly chassis proximate said upright fixture and in a parallel orientation to said base of said electronic assembly chassis.

13. The circuit board guiding ramp of claim 12 wherein said forward edge of said upright fixture is parallel to said edge of said circuit board as said circuit board is placed within said electronic assembly chassis and guided to said prescribed position.

14. A retaining mechanism for retaining a circuit board in a prescribed position comprising:

an electronic assembly chassis including a base;

said circuit board including an interior alignment slot proximate to an edge of the circuit board;

a deflecting lever having an angled top surface and a forward engagement surface, said deflecting lever extending in an upright orientation from said base of said electronic assembly chassis, said defecting lever defecting in a downward direction when said circuit board engages said angled top surface and engaging said edge of said circuit board with said forward engagement surface when said defecting lever returns to an upright position, and further projecting through said slot in said circuit board when said circuit board is initially placed within said electronic assembly chassis and parallel to said base of said electronic assembly chassis;

wherein said deflecting lever deflects in a downward orientation when said circuit board engages said angled top surface thereby allowing said circuit board to traverse over said top surface of said deflecting lever in a prescribed direction; and wherein said deflecting lever returns to its original upright position and said forward engagement surface of said deflecting lever engages said edge of said circuit board after said edge of said circuit board traverses said top surface thereby preventing said circuit board from traversing back over said top surface of said deflecting lever in a direction opposite to that of said prescribed direction.

15. The retaining mechanism of claim 14 wherein said circuit board further includes an alignment channel proximate an opposite edge of said circuit board, said retaining mechanism further including a circuit board alignment peg extending from said electronic assembly chassis and engaging with said alignment channel of said circuit board concurrent with said deflecting lever engaging said edge of said circuit board, said alignment peg preventing said circuit board from further moving in a forward or lateral direction.

16. The retaining mechanism of claim 14 wherein said circuit board further includes alignment notches on said side edges of said circuit board and said retention mechanism further includes one or more side retaining assemblies disposed on said base of said electronic assembly chassis in cooperative arrangement with said alignment notches and preventing said circuit board from moving in lateral and vertical directions as the circuit board traverses over said top surface of said deflecting lever.

17. The retaining mechanism of claim 16 wherein said side retaining assembly further includes:

a retaining wall extending in an upright orientation from a base of said electronic assembly chassis, said retaining wall having a lateral retaining surface;

a ledge laterally extending from said retaining wall and parallel to said base of said electronic assembly, said ledge having an upper support surface; and a nub laterally extending from said retaining wall, said nub having a lower engagement surface;

wherein said lateral retaining surface, upper support surface, and lower engagement surface define a retaining channel adapted to receive said circuit board and retain said circuit board from displacement in lateral and vertical directions; and wherein said laterally extending nub is dimensioned to fit within said alignment notches on said sides of said circuit board allowing said circuit board to be placed in said retaining channel from above said retaining assembly.

18. In an electronic assembly chassis having a plurality of retention structures including, a rear deflecting lever, and one or more alignment structures, including a guiding ramp, a method of installing a circuit board, the method comprising the steps of:

inserting an edge of said circuit board in an abutting relation against said guiding ramp of said electronic assembly chassis;

rotating said circuit board about said abutted edge into a prealigned orientation within said electronic assembly chassis; and sliding said prealigned circuit board in a prescribed direction until said deflecting lever locks said circuit board in a final position;

wherein said retention structures are arranged to cooperate with said circuit board in its prealigned position and further prevent said circuit board from moving in the lateral and vertical directions as said circuit board is slid into said final position.

19. A circuit board guide and retaining apparatus comprising:

a chassis having a base;

a circuit board having an upper surface, and a pair of side edges, the circuit board having an alignment notch on at least one of the side edges;

alignment structures on the base of the chassis aligning the circuit board within the chassis parallel to the base of the chassis; and a retaining assembly extending from the base of the chassis, the retaining assembly including an upright rigid projection having a lateral retaining wall extending from the base of the chassis, a ledge laterally extending from a lower section of the retaining wall, and a nub laterally extending from an upper section of the retaining wall, the arrangement of the nub, the retaining wall, and the ledge defining a retaining channel for retaining the circuit board.

20. The circuit board guide and retaining apparatus of claim 19 wherein said alignment structures aligning said circuit board comprise one or more circuit board guiding ramps disposed on said base of the chassis and receiving a rear edge of the circuit board and align said circuit board parallel to the base of the chassis.

21. The circuit board guide and retaining apparatus of claim 20 wherein said circuit board guiding ramp is an upright fixture at a preselected location on said base of said chassis, said circuit board guiding ramp having a forward facing arcuate surface, a forward edge of which is generally tangential to said base of said chassis, said forward facing arcuate surface of said circuit board guiding ramp receiving said rear edge of said circuit board as said circuit board is placed within said chassis and to align said circuit board proximate said preselected location and in a generally parallel orientation to said base of said electronic assembly chassis.

22. The circuit board guide and retaining apparatus of claim 19 wherein said circuit board further includes:

an interior alignment slot proximate a rear edge of said circuit board;

an alignment channel proximate a front edge of said circuit board; and alignment notches on side edges of said circuit board;

said alignment structures further including one or more protrusions extending from said chassis and aligning with said alignment channel, said alignment notches, said interior alignment slot, or said side edges of said circuit board thereby aligning said circuit board in a prescribed orientation within said chassis.

23. The circuit board guide and retaining apparatus of claim 19 including one or more vertical guide and retention assemblies extending from a forward wall of said chassis and guiding said circuit board into a final position while engaging said upper surface and a lower surface of said circuit board thereby restraining said circuit board from substantial displacement in a vertical direction.

24. The circuit board guide and retaining apparatus of claim 23 wherein said vertical guide and retention assembly further includes an upper retaining tab and a lower retaining tab with a spacing therebetween, the upper retaining tab extending from said forward wall of said chassis and having an angled guiding surface guiding said circuit board into said defined spacing between said upper and lower retaining tabs and further having a first retaining surface facing said defined spacing engaging said upper surface of said circuit board, said lower retaining tab extending from said forward wall of said chassis and also having an angled guiding surface guiding said circuit board into said defined spacing between said upper and lower retaining tabs and further having a second retaining surface facing said defined spacing engaging said lower surface of said circuit board such that, in conjunction with said first retaining surface, the second retaining surface restrains said circuit board in a vertical direction.

25. The circuit board guide and retaining apparatus of claim 19 further including one or more side guiding posts disposed on said base of said chassis and guiding said side edges of said circuit board during alignment and installation of said circuit board, said guiding posts further having a small ledge providing support to a lower surface of said circuit board.

* * * * *